(12) United States Patent
Wu

(10) Patent No.: US 7,583,284 B2
(45) Date of Patent: Sep. 1, 2009

(54) METHOD FOR ARRANGING PRINT HEAD CHIPS

(75) Inventor: Ming-Che Wu, Nan-Tou (TW)

(73) Assignee: Universal Scientific Industrial Co., Ltd., Nantou (TW)

( * ) Notice: Subject to any disclaimer, the term of this patent is extended or adjusted under 35 U.S.C. 154(b) by 32 days.

(21) Appl. No.: 12/010,664

(22) Filed: Jan. 29, 2008

(65) Prior Publication Data

US 2009/0189949 A1 Jul. 30, 2009

(51) Int. Cl.
*B41J 2/45* (2006.01)
*H01L 21/76* (2006.01)

(52) U.S. Cl. ........................... 347/238; 438/401
(58) Field of Classification Search ................ 347/238; 257/98, 99, 797; 438/401
See application file for complete search history.

(56) References Cited

U.S. PATENT DOCUMENTS 6,278,193 B1 * 8/2001 Coico et al. ................. 257/797

6,831,673 B2 * 12/2004 Wakisaka et al. ........... 347/238

FOREIGN PATENT DOCUMENTS

JP 2006027197 A * 2/2006

* cited by examiner

*Primary Examiner*—Hai C Pham
(74) *Attorney, Agent, or Firm*—Kile Goekjian Reed & McManus PLLC

(57) ABSTRACT

A method for arranging print head chips, includes: (a) setting a first fiducial mark and a second fiducial mark on a PCB for determining coordinate positions of a plurality of array units that are arranged on the PCB and calculating a print range of the array units, wherein each array unit has a plurality of spots that are transversely arranged from the first one of the spots to the last one of the spots in sequence; (b) setting a third fiducial mark as a start point for arranging the first spot of a first array unit of the array units on the PCB; and (c) arranging other array units on the PCB in sequence according to the coordinate positions and the start point.

8 Claims, 4 Drawing Sheets

US 7,583,284 B2

METHOD FOR ARRANGING PRINT HEAD CHIPS

BACKGROUND OF THE INVENTION

1. Field of the Invention

The present invention relates to a method for arranging print head chips, and particularly relates to a method of arranging print head chips using a single arrangement start point in order to obtain a print head with high print quality.

2. Description of the Related Art

In the typical printer technology, a laser is used as a light source in a printer head to scan and transfer the printing information as light signals to a rotating drum in order to generate electrostatic latent images formed on the rotating drum. Moreover, the printing method further includes a toner absorbing step, a transferring step, a hot pressing step, an electrostatic discharging step etc. to achieve printing requirement. However, a laser printer head of the prior art has many optical components, and the mechanism of the laser printer head is complex and the optical path of the laser printer head is very longer. Hence, the optical structure is quite complex and difficult to reduce in size for using a laser in this way. Therefore, the current trend is toward using light emitting diodes to replace lasers as the light sources in printer heads, which can simplify the optical structure.

For example, a printer resolution is 600 dpi (dots per inch) on A4 size paper. A PCB has 39 LED array chips and 39 drive ICs, and each LED array chip has 128 LED spots (an LED spot is the light emitting portion of an LED). Hence, there are 4992 LED spots on the PCB to comprise a printing width of 211 mm.

A further requirement is to reduce the volume of each light emitting diode so as to increase the printer resolution. The number of light emitting diodes per unit area in the printer head can be increased when the volume of each light emitting diode is reduced. Because the yield rate of LED array chips is increased, 26 LED array chips and 26 drive ICs are applied on the PCB. Each LED array chip has 192 LED spots. Hence, there are 4992 LED spots on the PCB to comprise a printing width of 211 mm, too.

Moreover, according to the typical packaging method, a highly precise packaging apparatus is required to arrange the light emitting diode arrays and the driver integrated circuits so that they are exactly parallel to each other in a printed circuit board. Then, a wire bonding process is performed to form about 5000 wires between the light emitting diode arrays and the driver integrated circuits if the printer resolution is 600 dpi (dots per inch) on A4 size paper. The driver integrated circuits drive the light emitting diode arrays through these wires.

FIG. 1 shows a flowchart of a method for arranging print head chips on a PCB according to the prior art. For example, if the 26 LED array chips is used, the method for arranging print head chips includes:

Step S100: setting a fiducial mark as a reference fiducial point on a PCB for arranging a first LED array chip on the PCB;

Step S102: taking a position of a last LED spot of the first LED array chip as another reference fiducial point for arranging a second LED array chip adjacent to the first LED array chip on the PCB; and Step S104: repeating step S102, taking a position of a last LED spot of a last LED array chip as another reference fiducial point for arranging a next LED array chip adjacent to the last LED array chip on the PCB. In other words, the LED array chips are arranged on the PCB in sequence.

FIG. 2 shows a schematic view of offsets of LED spots arranged along an x-direction and a y-direction according to the prior art. There are two problems when using the printer resolution is 600 dpi (dots per inch) on A4 size paper, as following:

1. An offset along an x-direction between the first LED spot $d_{1a}$ on a substrate $b_a$ and a last LED spot $d_{192a}$ on the substrate $b_a$ is about 211 μm±300 μm. In other words, a maximum offset Xn along the x-direction between the first LED spot $d_{1a}$ and the last LED spot $d_{192a}$ is 300 μm. In addition, with regard to the prior art with the size of A4 and the resolution of 600 dpi, a distance of each spot is about 42.3 cm. Hence, the distance of the maximum offset Xn along the x-direction is about 7 spot (300/42.3=7.09) in the prior art.

2. A maximum offset Yn along a y-direction between the first LED spot $d_{1a}$ on the substrate $b_a$ and the last LED spot $d_{192a}$ on the substrate $b_a$ is 150 μm. In addition, with regard to the prior art with the size of A4 and the resolution of 600 dpi, a distance of each spot is about 42.3 μm. Hence, the distance of the maximum offset Yn along the y-direction is about 3.5 spot (150/42.3=3.54) in the first embodiment.

In order to solve the problems of offset along x-direction and y-direction, it is necessary to do position compensation for satisfying the print need of accurate color trap. The method for solving the problems includes following two method:

First method includes: firstly, measuring the 4992 LED spots to obtain x and y coordinate positions or measuring the 4992 LED spots and using a semiconductor laser amplifier (SLA) to obtain imaged x and y coordinate positions; and then calculating the offset of the 4992 LED spots and proceeding printing data shift.

Second method includes: firstly, decreasing measurement points of the 4992 LED spots; and then calculating a formula to do curve fitting via the measured data in order to obtain another formula with good linearity.

However, no matter which solve method is used in the prior art, abovementioned steps such as measuring LED spots and position compensation and the follow-up step of printing test and verifying print quality need to pay large cost.

SUMMARY OF THE INVENTION

One particular aspect of the present invention is to provide a method for arranging print head chips.

The method for arranging print head chips can be applied to an EPG (Electrophotography) printer. Hence, a plurality of LED array chips can be arranged on a PCB via a single arrangement start point and a way of step by step method.

The method for arranging print head chips can be applied to an inkjet printer. Hence, a plurality of inkjet hole array chips can be arranged on a PCB via a single arrangement start point and a way of step by step method.

In order to achieve the above-mentioned aspects, the present invention provides a method for arranging print head chips, comprising: (a) setting a first fiducial mark and a second fiducial mark on a PCB for determining coordinate positions of a plurality of array units that are arranged on the PCB and calculating a print range of the array units, wherein each array unit has a plurality of spots that are transversely arranged from the first one of the spots to the last one of the spots in sequence; (b) setting a third fiducial mark as a start point for arranging the first spot of a first array unit of the array units on the PCB; and (c) arranging other array units on the PCB in sequence according to the coordinate positions and the start point. In addition, a print head with high print quality manufactured by above-mentioned method can be an LED print head (LPH) or an inkjet print head.

Therefore, because the method of the present invention is step by step and mate with accurate chip cutting technology, the print head such as the LED print head or the inkjet print head manufactured by above-mentioned method has a good linearity and good space arrangement precision. Moreover, the method of the present invention can achieve high resolution with 600~1200 dpi without doing position compensation.

Hence, the method of the present invention can solve the problem of low linearity of the prior art and increase the precision of color trap. In addition, the method of the present invention does not need the follow-up step of printing test and verifying print quality, so the method has a low cost and a high print quality.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

The present invention provides a method for arranging print head chips, including:

Step (a): setting a first fiducial mark and a second fiducial mark on a PCB for determining coordinate positions of a plurality of array units that are arranged on the PCB and calculating a print range of the array units, and each array unit having a plurality of spots that are transversely arranged from the first one of the spots to the last one of the spots in sequence;

Step (b): setting a third fiducial mark as a start point for arranging the first spot of a first array unit of the array units on the PCB; and Step (c): arranging other array units on the PCB in sequence according to the coordinate positions and the start point in order to finish the manufacture of a print head with high print quality. In addition, the print head with high print quality can be an LED print head (LPH) applied to an EPG (Electrophotography) printer or an inkjet print head applied to an inkjet printer.

Figure 1:
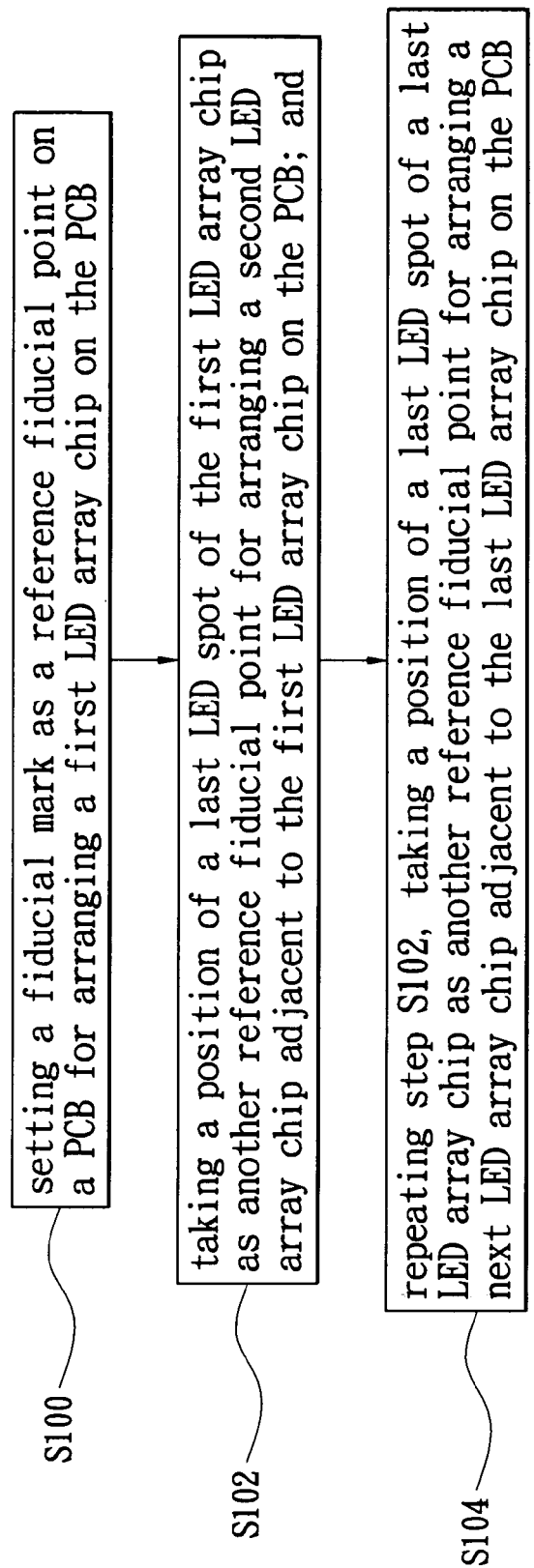
FIG. 1 is a flowchart of a method for arranging print head chips on a PCB according to the prior art.
Figure 2:
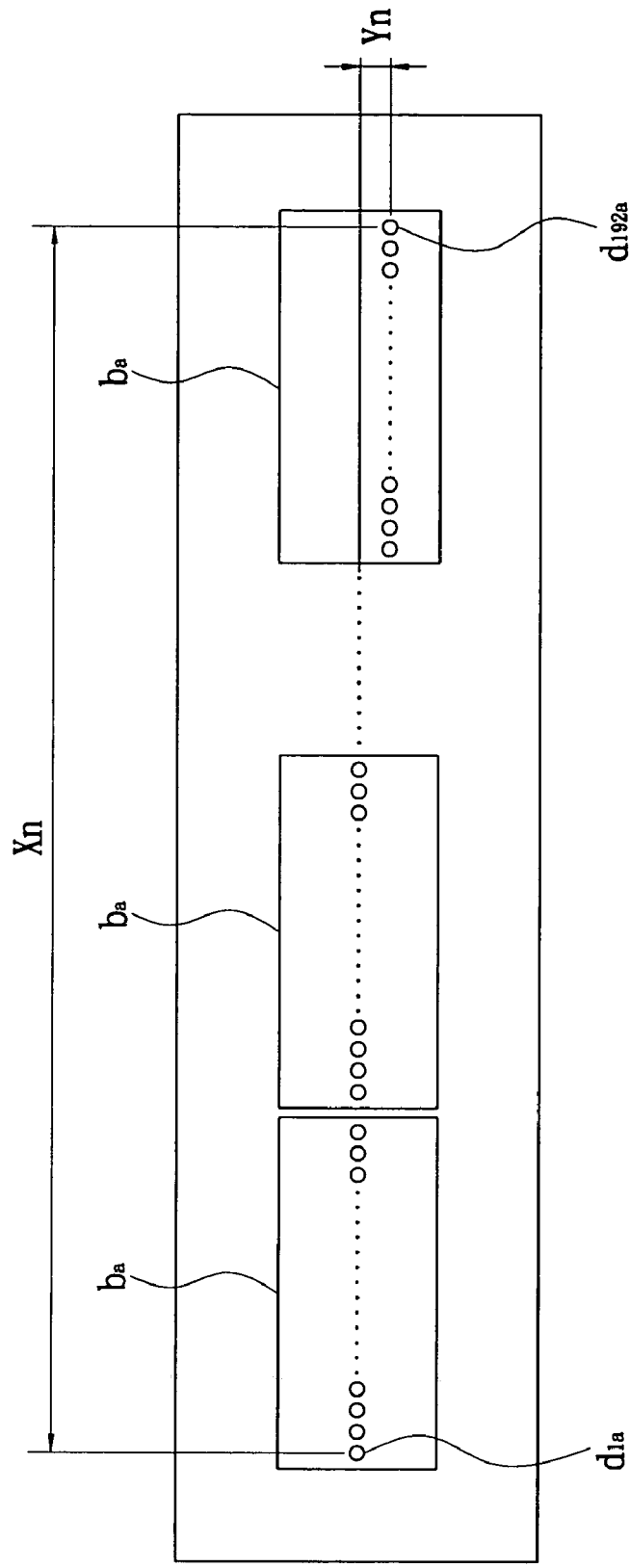
FIG. 2 is a schematic view of offsets of LED spots arranged along an x-direction and a y-direction according to the prior art.
Figure 3:
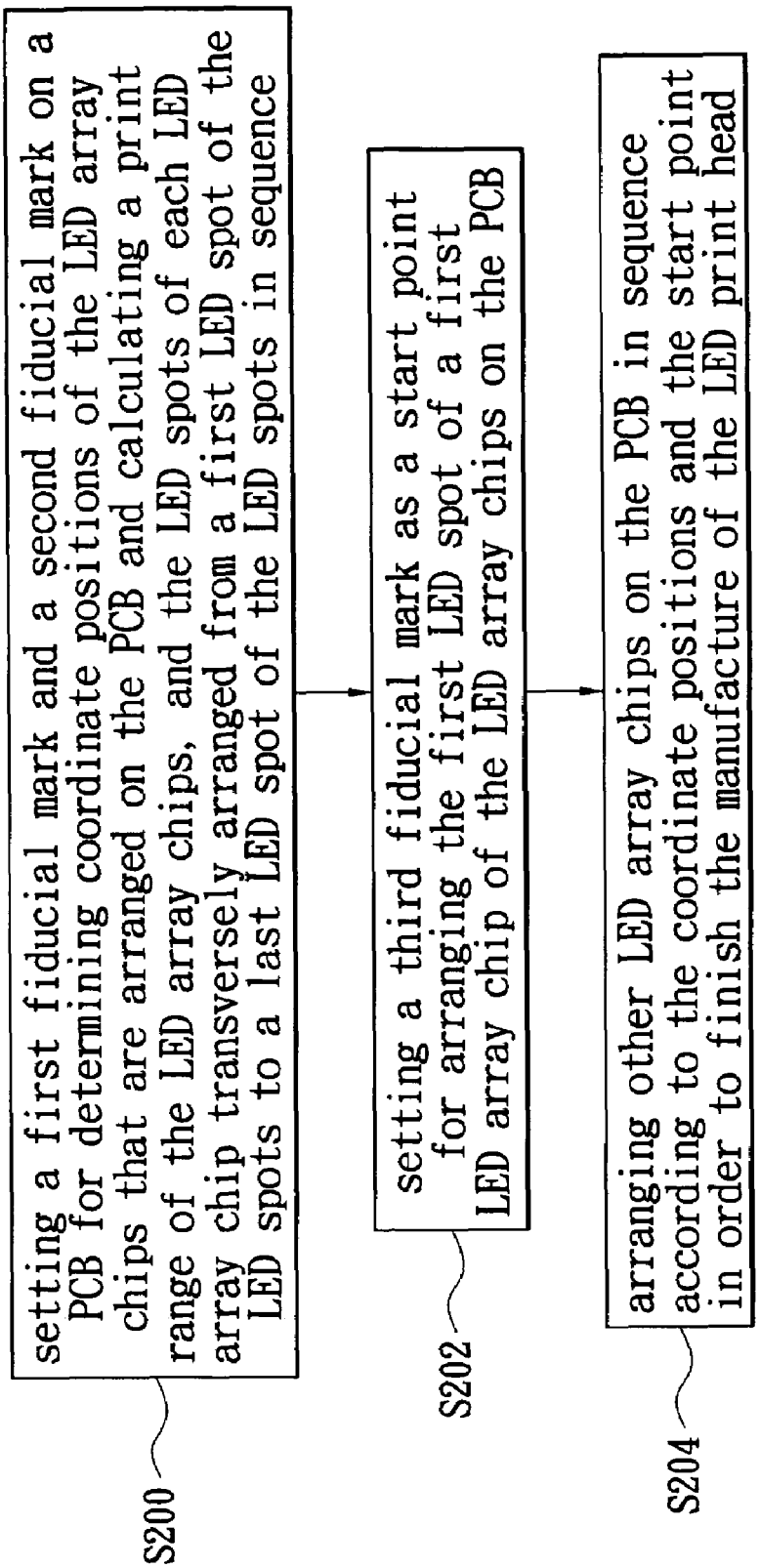
FIG. 3 is a flowchart of a method for arranging print head chips according to the first embodiment of the present invention.
Figure 4:
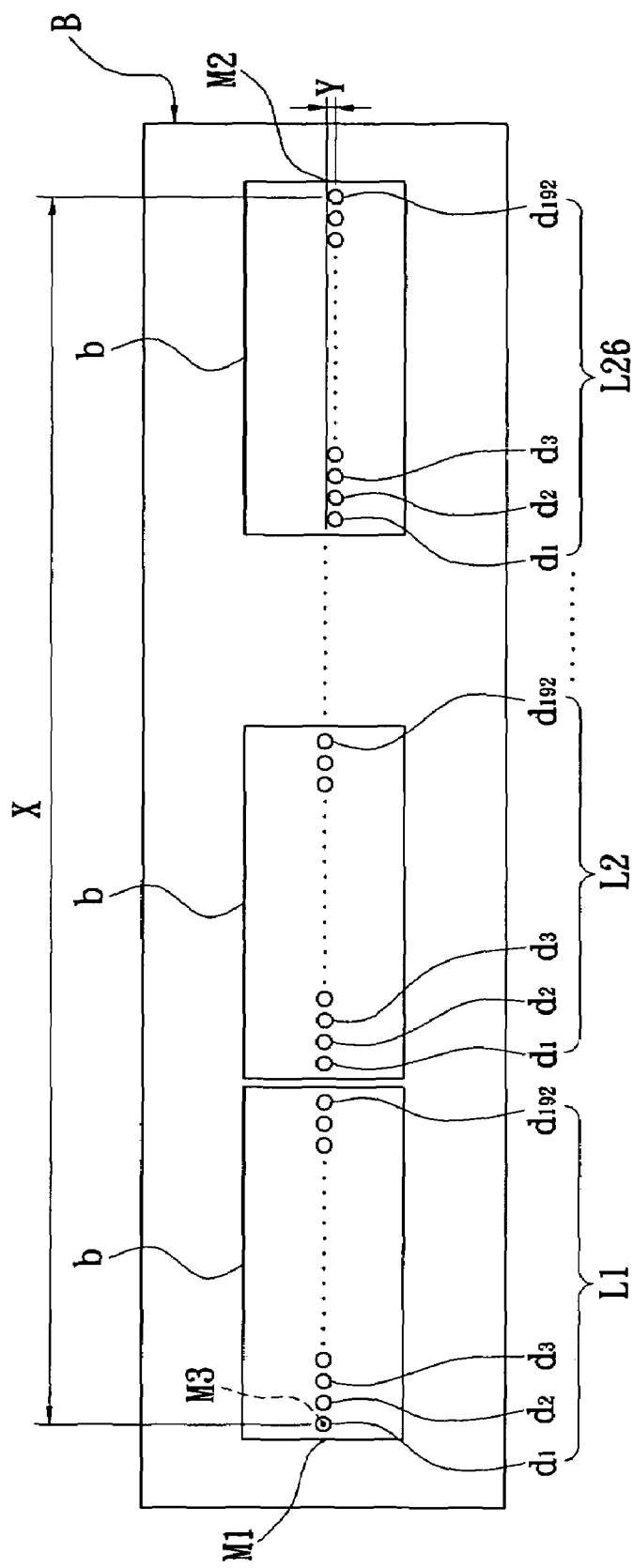
FIG. 4 is a schematic view of a print head with high print quality manufactured by the method of the first embodiment of the present invention.

Referring to FIGS. 3-4, FIG. 3 shows a flowchart of a method for arranging print head chips according to the first embodiment of the present invention, and FIG. 4 shows a schematic view of a print head with high print quality manufactured by the method of the first embodiment of the present invention. For example, the print head with high print quality is the LED print head (LPH).

FIGS. 3-4 disclose 26 array units with a size of A4 (298 mm×211 mm) and a resolution of 600 dpi (spot per inch), and each array unit has 192 spots. Each array unit has a substrate b, and the 192 spots of each array unit are arranged on the substrate b. Moreover, in the first embodiment, the 26 array units are 26 LED array chips (L1~L26), and the 192 spots of each array unit are 192 LED spots ($d_1$~$d_{192}$).

Therefore, referring to FIG. 4, the first embodiment of the present invention provides a method for arranging print head chips, including:

S200 is: setting a first fiducial mark M1 and a second fiducial mark M2 on a PCB B for determining coordinate positions of the LED array chips (L1~L26) that are arranged on the PCB B and calculating a print range of the LED array chips (L1~L26), and the LED spots ($d_1$~$d_{192}$) of each LED array chip (L1~L26) transversely arranged from a first LED spot $d_1$ of the LED spots ($d_1$~$d_{192}$) to a last LED spot $d_{192}$ of the LED spots ($d_1$~$d_{192}$) in sequence. Therefore, a straight line is defined by the first fiducial mark M1 and the second fiducial mark M2, so the arrangement of the LED array chips (L1~L26) has a high linearity.

S202 is: setting a third fiducial mark M3 as a start point for arranging the first LED spot $d_1$ of a first LED array chip L1 of the LED array chips (L1~L26) on the PCB B.

S204 is: arranging other LED array chips (L2~L26) on the PCB B in sequence according to the coordinate positions and the start point in order to finish the manufacture of the LED print head (LPH).

Moreover, an offset along an x-direction between the first LED spot $d_1$ of the first LED array chip L1 of the LED array chips (L1~L26) and a last LED spot $d_{192}$ of a last LED array chip L26 of the LED array chips (L1~L26) is about 211 μm±20 μm. In other words, a maximum offset X along the x-direction between the first LED spot $d_1$ and the last LED spot $d_{192}$ is 20 μm. In addition, with regard to the first embodiment with the size of A4 and the resolution of 600 dpi, a distance of each spot is about 42.3 μm. Hence, the distance of the maximum offset X along the x-direction is less than 0.5 spot (20/42.3=0.47) in the first embodiment.

Furthermore, a maximum offset Y along a y-direction between the first LED spot $d_1$ of the first LED array chip L1 of the LED array chips (L1~L26) and the last LED spot $d_{192}$ of a last LED array chip L26 of the LED array chips (L1~L26) is 15 μm. In addition, with regard to the first embodiment with the size of A4 and the resolution of 600 dpi, a distance of each spot is about 42.3 μm. Hence, the distance of the maximum offset Y along the y-direction is less than 0.4 spot (15/42.3=0.35) in the first embodiment.

For example, the print head with high print quality is the inkjet print head. The LED array chips (L1~L26) are replaced into a plurality of inkjet hole array chips, and the LED spots ($d_1$~$d_{192}$) are replaced into a plurality of inkjet holes.

In conclusion, the method for arranging print head chips can be applied to an EPG (Electrophotography) printer. Hence, a plurality of LED array chips can be arranged on a PCB via a single arrangement start point and a way of step by step method.

The method for arranging print head chips can be applied to an inkjet printer. Hence, a plurality of inkjet hole array chips can be arranged on a PCB via a single arrangement start point and a way of step by step method.

Therefore, because the method of the present invention is step by step and mate with accurate chip cutting technology, the print head such as the LED print head or the inkjet print head manufactured by above-mentioned method has a good linearity and good space arrangement precision. Moreover, the method of the present invention can achieve high resolution with 600~1200 dpi without doing position compensation.

Hence, the method of the present invention can solve the problem of low linearity of the prior art and increase the precision of color trap. In addition, the method of the present invention does not need the follow-up step of printing test and verifying print quality, so the method has a low cost and a high print quality.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for arranging print head chips, comprising:
   (a) setting a first fiducial mark and a second fiducial mark on a PCB for determining coordinate positions of a plurality of array units that are arranged on the PCB and calculating a print range of the array units, wherein each array unit has a plurality of spots that are transversely arranged from the first one of the spots to the last one of the spots in sequence;
   (b) setting a third fiducial mark as a start point for arranging the first spot of a first array unit of the array units on the PCB; and
   (c) arranging other array units on the PCB in sequence according to the coordinate positions and the start point.

2. The method as claimed in claim 1, wherein each array unit has a substrate, and the spots of each array unit are arranged on the substrate.

3. The method as claimed in claim 1, wherein an offset along an x-direction between the first spot of the first array unit of the array units and a last spot of a last array unit of the array units is about 211 µm±20 µm.

4. The method as claimed in claim 1, wherein a maximum offset along a y-direction between the first spot of the first array unit of the array units and a last spot of a last array unit of the array units is 15 µm.

5. The method as claimed in claim 1, wherein each array unit is an LED array chip, and each spot is an LED spot.

6. The method as claimed in claim 1, wherein each array unit is an inkjet hole array chip, and each spot is an inkjet hole.

7. A print head manufactured according to the method of claim 1 being an LED print head (LPH).

8. A print head manufactured according to the method of claim 1 being an inkjet print head.

* * * * *